United States Patent [19]
Kendall

[11] 3,881,244
[45] May 6, 1975

[54] METHOD OF MAKING A SOLID STATE INDUCTOR

[75] Inventor: Don Leslie Kendall, Richardson, Tex.

[73] Assignee: Texas Instruments Incorporated, Dallas, Tex.

[22] Filed: Aug. 3, 1973

[21] Appl. No.: 385,625

Related U.S. Application Data

[63] Continuation of Ser. No. 259,325, June 2, 1972, abandoned.

[52] U.S. Cl. .................... 29/602; 29/625; 336/200; 336/223

[51] Int. Cl. .................... H01f 7/06

[58] Field of Search ............ 29/602, 606, 625, 580, 29/583; 317/235 H, 235 J, 235 P, 101 A, ; 336/200, 223, 225

[56] References Cited

UNITED STATES PATENTS

| | | | |
|---|---|---|---|
| 3,300,832 | 1/1967 | Cave | 29/583 X |
| 3,381,369 | 5/1968 | Stoller | 29/580 |
| 3,553,533 | 1/1971 | Haberecht | 317/101 A |
| 3,561,110 | 2/1971 | Feulner et al. | 29/602 |
| 3,638,156 | 1/1972 | West | 336/200 |
| 3,731,005 | 5/1973 | Shearman | 336/200 X |

*Primary Examiner*—Carl E. Hall
*Attorney, Agent, or Firm*—Harold Levine; James T. Comfort

[57] ABSTRACT

Disclosed is a solid state inductor which is formed in a monocrystalline semiconductor body. An electrically isolated helix comprised of conductive studs selectively interconnected by electrical contacts circumscribes an electrically isolated core material. Typically the studs are comprised of the semiconductor slice material, or are deposited conductor. Also disclosed is an integrated circuit having such solid state inductor therein.

5 Claims, 18 Drawing Figures

METHOD OF MAKING A SOLID STATE INDUCTOR

This is a continuation of application Ser. No. 259,325, filed June 2, 1972 and now abandoned.

This invention relates to inductors and methods of making inductors and more specifically to solid state inductors formed in semiconductor monolithic bodies and methods of making same.

Inductors with practical values of inductance and Q have traditionally been difficult components to fabricate in semiconductor monolithic bodies and especially in integrated circuits. Attempts to form inductors having practical values of inductance utilizing flat spirals have been relatively unsuccessful, and thin film processes have remained most difficult with typically unsatisfactory results. These difficulties have resulted generally in the utilization of small toroidal coils made of powdered iron or special ferrites which are usually external to the circuit, either within or external to the device package.

Accordingly, it is an object of the present invention to provide a semiconductor having high inductance and high quality factor. It is another object of the present invention to provide a semiconductor inductor having a deposited high permeability core. It is a further object of the invention to provide an integrated circuit having a semiconductor inductor therein. It is still a further object of the present invention to provide a method of making a semiconductor inductor. It is yet a further object of the present invention to provide a method of making an integrated circuit having a semiconductor inductor therein.

Briefly, and in accordance with the present invention, a solid state inductor is formed in a semiconductor slice by providing a conductor circumscribing an insulated core material in a helix configuration. Electrically conductive studs extend in isolation through the thickness of the slice and are selectively interconnected by metallic contacts in a helix configuration. The conductive studs are formed from the semiconductor slice, or they are comprised of a deposited conductor.

In a second embodiment of the invention, the semiconductor slice material is utilized as the insulated core material. A highly doped semiconductor buried layer is utilized as selective interconnects, or metallic conductors are utilized on the front and back sides of the slice and as feedthroughs through the slice. Such interconnections are easily connected to other circuit elements in the same substrate.

The novel features believed to be characteristic of this invention are set forth in the appended claims. The invention itself, however, as well as other objects and advantages thereof may be best understood by reference to the following detailed description when read in conjunction with the accompanying drawings, wherein:

DETAILED DESCRIPTION OF THE INVENTION

For purposes of graphic illustrational simplicity and clarity, the figures contained herein are not geometrically proportioned. The dimensions given in the following detailed description of each figure are to be construed as exemplary dimensions and are not be considered in disagreement with the drawings. Furthermore, as a plurality of embodiments have been illustrated those embodiments having common functional elements with other embodiments shall have a similar part number for clarity and simplification of description.

Figure 1:
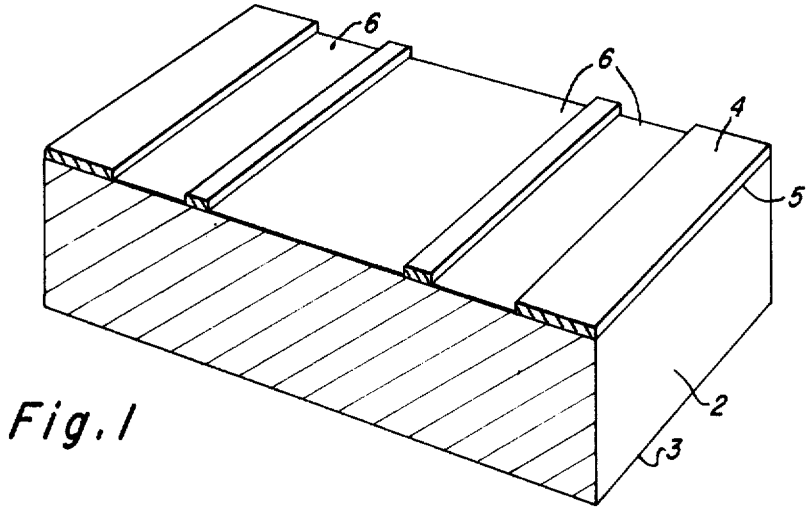
FIGS. 1–9 are perspective views illustrating various stages during the production of one embodiment of the present invention.

Referring now to the drawings, FIG. 1 illustrates a portion of a slice of semiconductor material 2 typically utilized in the invention. In this embodiment a 20 mil thick slice 2 is monocrystalline silicon having at most a 25 ohm-centimeter resistivity and, for example, is P-type silicon doped with boron, gallium or other Group III elements. A doping concentration of at least $5 \times 10^{14}$ provides such a resistivity in silicon. A crucial feature of the slice 2 for the first embodiment is that it has a crystal orientation of (110) as denoted by conventional Miller indices. Formation of (110) monocrystalline silicone materials is well-known in the art and is grown in ingots and sliced thereafter such that the resulting surfaces 5 and 3 are substantially coplanar with the (110) crystallographic plane. Accordingly, upper surface 5 and lower surface 3 of the slice 2 lie in the (110) plane. However, the slice may be cut such that the surfaces are several degrees off the (110) plane in order to simplify subsequent processing. After removal from the ingot, the surfaces 3 and 5 are finished by conventional lapping, grinding or chemical polishing techniques. Substrate 2 is of any suitable length and width, but typically has a depth of 20 milli-inches (mils).

A layer 4 of silicon nitride overlies upper surface 5 and is typically 5,000 angstroms thick. Other etch resistant materials besides silicon nitride are suitable, such as silicon dioxide or gold.

Conventional photolithographic/etch techniques provide a desired mask pattern in the nitride layer 4. Utilizing principles of alignment of the pattern in the nitride layer 4 which are well-known in the art of orientation dependent etch (ODE), apertures 6 in FIG. 1 are defined in the masked pattern substantially parallel to the line defined by the intersection of the (111) plane, with the substantially (110) surface. It is to be understood that hereafter a (110) surface is denoted as a surface substantially lying in the (110) plane, but may be at as much an angle as 20° to the (110) plane. As is well-known, a (110) crystallographic oriented silicon body has two sets of (111) planes intersecting and perpendicular to the (110) surface. One of the set of (111) planes crosses the other on the (110) surface at angles of 70.53° and 109.47°.

After having etched the desired masking pattern of FIG. 1 in the nitride layer 4, the substrate 2 is orientation dependent etched. That is, the moats formed thereby take the form of apertures 8 within the substrate 2, which are bounded by (111) planes, and accordingly are perpendicular to the (110) surfaces 3 and 5. The etchant utilized exhibits a slower etch rate in the (111) plane than it exhibits in the (110) plane or other planes. Various etching solutions exhibit this property as is disclosed in *J. Electrochemical Society Journal*, Vol. 114, 1967, page 965. For a more detailed explanation of the phenomena of orientation dependent etching (110) material along the (111) planes, reference is made to copending patent application, assigned to the assignee of this application, IMPROVEMENT IN METHODS FOR FORMING CIRCUIT COMPONENTS WITHIN A SUBSTRATE AND SEMICONDUCTOR SUBSTRATE, Ser. No. 788,177, filed Dec. 31, 1968.

A 50% potassium hydroxide/water mixture is utilized for orientation dependent etch. At 85°C. the etch rate in the (110) direction along the (111) plane is approximately 0.087 mils per minute. Accordingly, a slice 20 mils thick etches completely in the (110) direction in approximately 230 minutes. As noted earlier, the grooves produced thereby are bounded by sidewalls substantially perpendicular on all sides to the (110) surface.

In FIGS. 1–4 the nitride layer 4 is shown only coating upper surface 5. It is to be understood that lower surface 3 and the four sides of the substrate 2 are also protected by a similar nitride coating of the same thickness. The upper layer of nitride 4 having therein the mask pattern is shown for clarity and simplicity.

Figure 2:
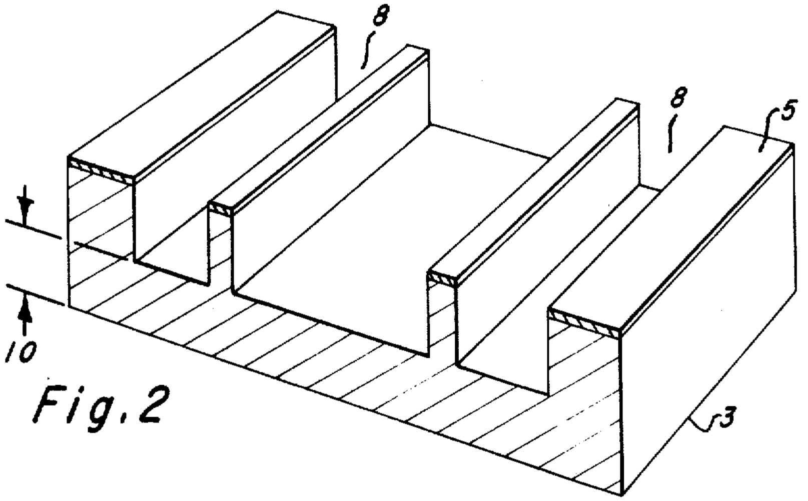

After etching the substrate for approximately 175 minutes, grooves 8 are produced in FIG. 2, which are approximately 15 mils deep. The remaining 5 mils of substrate, which is denoted by numeral 10, provides a suitable mechanical support for ease in handling the slice. The structure is characterized as a body of silicon material having upper and lower surfaces lying in the (110) plane; overlying upper surface 5 is a nitride masking layer 4; and a selective pattern of orientation dependent etched grooves 8 are bounded by sidewalls which are substantially perpendicular to the (110) plane. Although depicted herein as flat, the bottom portions of grooves 8 are typically V-shaped. Grooves having such V-shaped bottom portions are equally suitable within the scope of this invention.

Figure 3:
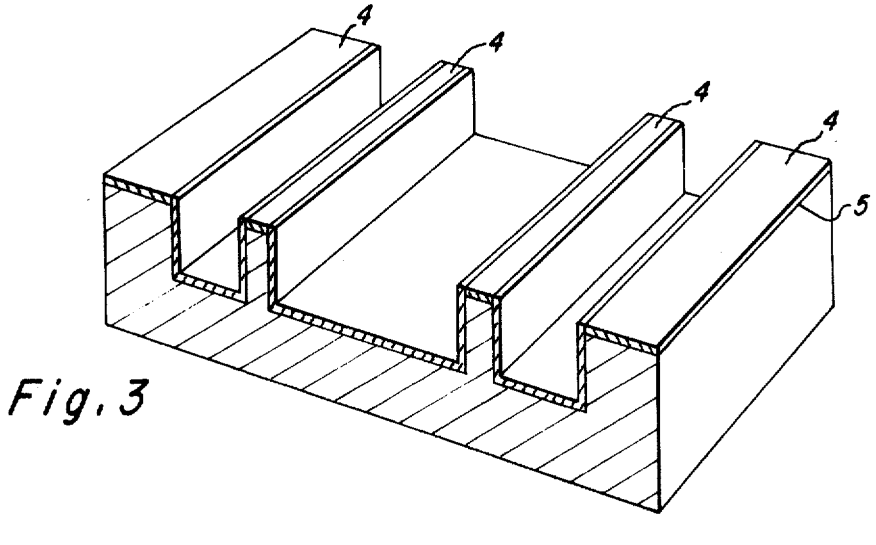
Figures 4, 5, 6:
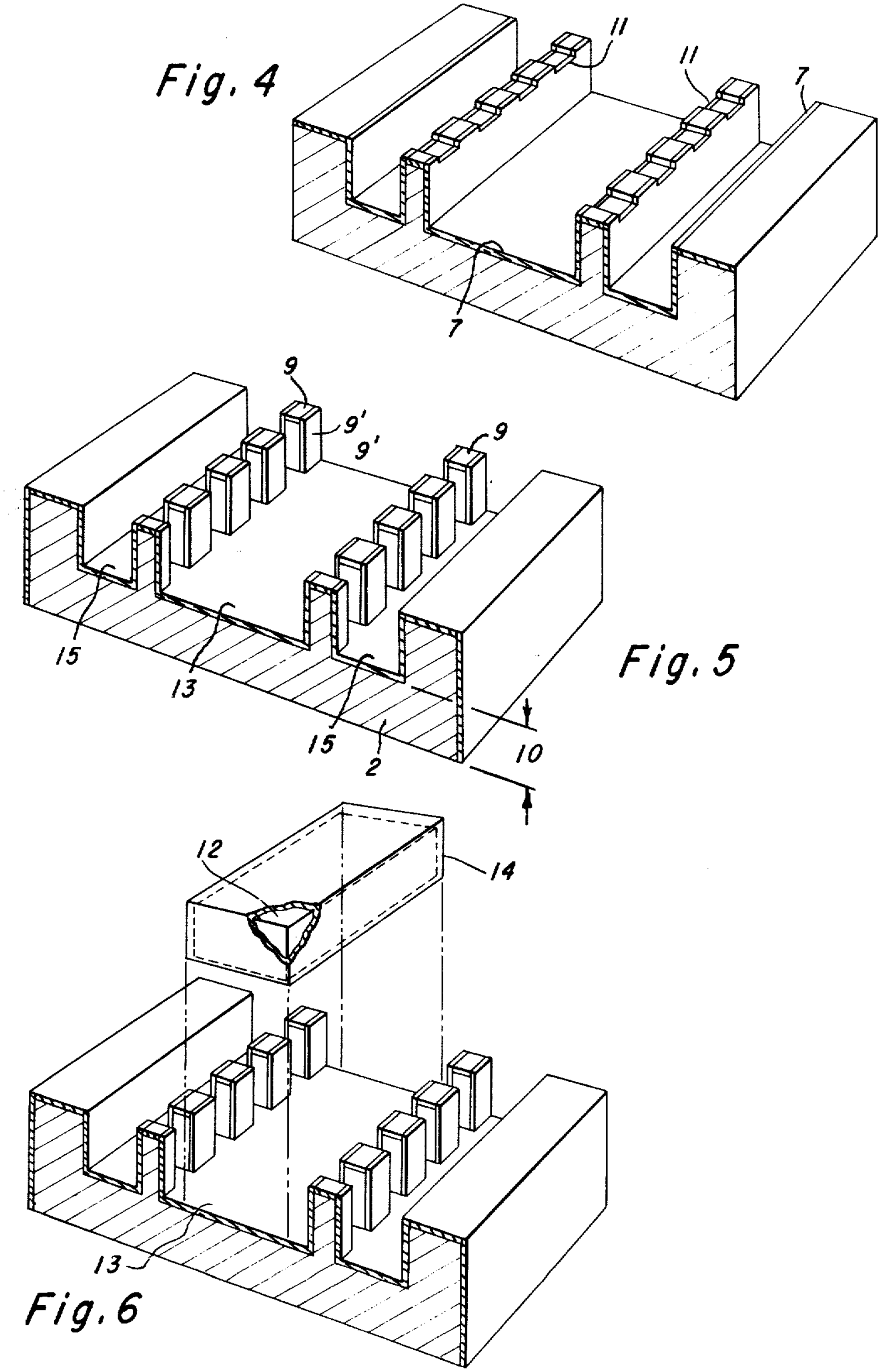

Referring to FIGS. 3 and 4, a second ODE mask layer 7 is formed on the upper surface 5 using techniques in the art. Nitride layer 4 has formed therein apertures 11 which lie in the direction formed by the intersection of the other of the (111) planes, with the (110) surface. Mask 7 is an oxide layer coating the sidewalls and bottoms of the grooves 8 having a thickness of 20,000 angstroms. It is noted that the sides of apertures 11 lie at an angle of 70.53° and 109.47° with the side of apertures 6 of mask 4, as both apertures 6 and 11 have sides lying in the line defined by the intersection of the (111) plane with the (110) surface. Variances of several degrees in the alignment of masks 4 and 7 with respect to the (111) plane are allowable if minimum geometries are not required. Aligning a mask several degrees off the (110)/(111) intersection allows undercutting and forms grooves having sidewalls not perpendicular to the (110) plane, which decreases packing densities.

A subsequent orientation dependent etch similar to the etch earlier described in the formation of FIG. 2 provides the basic structure depicted in FIG. 5. This second etch proceeds to about the same 15 mil depth as earlier described, but this is not critical. In FIG. 5, first and second rows of studs 9 having sidewalls 9' are shown selectively spaced from one another. Sidewalls 9' lie at an angle of 70.53° with each other. Oxide layer 7 and nitride layer 4 remain coating the upper surface 5 in FIG. 5 for electrical isolation purposes, which purposes become apparent after subsequent processing steps.

For certain applications the resistance of the studs 9 may be too high, as they are comprised of the lightly doped substrate 2. Accordingly, by selectively removing the oxide layer 7 coating surfaces 9' of studs 9, and thereafter diffusing a highly doped layer of the same conductivity type as the substrate 2 into the studs 9, the resistance in the helix is improved. Of course, the least resistance in the studs 9 is provided if, instead of diffusing a highly doped region, a metal conductive coating is deposited on the studs 9. Thereafter, a new isolative coating of oxide is applied over the studs 9.

It is emphasized that ODE etching sequence according to mask 4 initially and thereafter according to the mask 7 is purely a matter of choice. An etch forming longer narrow grooves initially is also suitable, followed by the second etch forming the wider grooves and studs. Similarly a single masking/ODE step may provide the structure of FIG. 5 by utilizing an initial nitride mask pattern comprising first and second parallel rows of diamond shaped apertures selectively spaced.

FIG. 6 depicts the deposition of an insulated core material selectively deposited in region 13 between the rows of studs 9. Although FIG. 6 depicts a discrete body of core material 12 coated with isolation layer 14, it is emphasized that such a well-defined discrete body need not be placed therein. That is, by well-known masking/metal deposition techniques such as shadow mask techniques, a metallic core material 12 is deposited selectively in the region 13. Any excess metal lying outside the rows of studs may be removed to provide the structure of FIG. 6. By utilizing a deposition to provide the core, the isolation coating 14 is not required.

Figure 7:
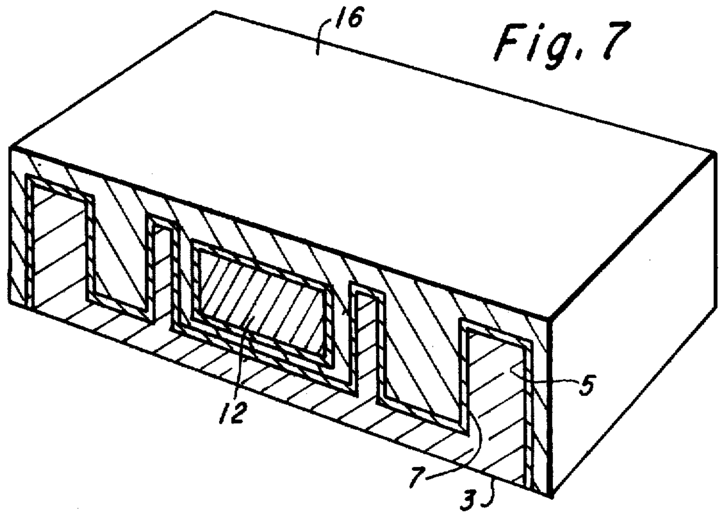

FIG. 7 depicts the subsequent step of circumfusing the core material 12 into the device structure. A suitable circumfusing material 16 is an oxide or a polycrystal such as silicon. Techniques for growing polycrystalline silicon are well-known in the art and are suitable for providing the circumscribing material 16.

Figure 8:
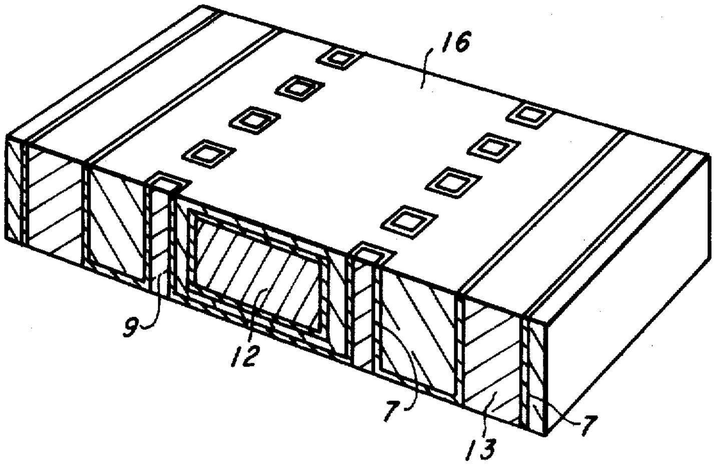

After providing the structure of FIG. 7, the excess semiconductor material, metal, and oxide which overlies original surface 5 is thereafter removed by any suitable technique such as lapping. This lapping process includes the removal of the nitride layer 4 so that the upper regions of studs 9 are exposed. Lower surface 3 is also lapped or otherwise removed for an approximate depth of 5 mils until the lower regions of studs 9 are exposed. After the lapping step the solid state structure of FIG. 8 is produced.

As the upper and lower ends of studs 9 are exposed during the lapping steps above described, metal deposition techniques well-known in the art allow selective interconnection of the studs 9. The preferred metal interconnect scheme is a helix configuration, whereby the plurality of metal interconnects 17 and the studs 9 circumscribe the insulated core material 12. The completed device of FIG. 9 is then connected to other device elements for providing inductance thereto.

Figure 9:
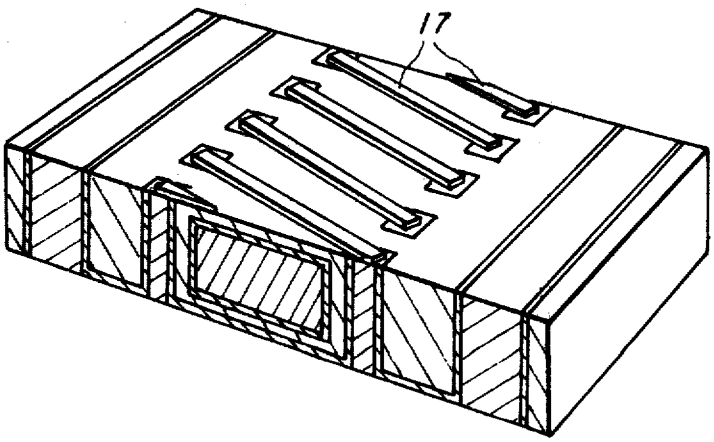

The resulting device illustrated in FIG. 9 is a solid state inductor. Calculation of inductance for such an embodiment is provided by the wellknown formula of Equation 1 below:

$$\begin{aligned} L &= 4\pi N^2 A \mu (10^{-9})/l \text{ henrys} \\ &= 4\pi (200)^2 (3.8 \times 10^{-2} \text{cm}^2)/1 \text{ cm} \times 10^{-9} \text{ henrys} \\ &= 18.9 \times 10^{-6} \text{ henrys} \\ &= 18.9 \text{ microhenrys (for } \mu = 1) \end{aligned} \qquad \text{Equation 1}$$

wherein:

slice thickness, $t$ = 15 mils = 0.038 cm coil width, $w$, (distance between rows of studs 9) = 400 mils ≈ 1 cm so that cross-sectional area $A = (w \times t) = 3.8 \times 10^{-2} cm^2$ coil length l = 400 mils = 1 cm and number of turns $N = 200$ Thus, assuming permeability $\mu = 1$ which is a suitable approximation for air or silicon or silicon dioxide, 18.9 microhenrys of inductance is provided by the embodiment having the above-described dimensions. By utilizing a soft iron having a permeability of 7,000 instead of 1 as the core material, 132 milli-henrys of inductance is produced. Certain ceramics provide still larger values of permeability and are suitable core materials. It is thus seen that a solid state semiconductor inductor has been produced which is able to provide practical values of inductance.

A SECOND EMBODIMENT

Figure 10:
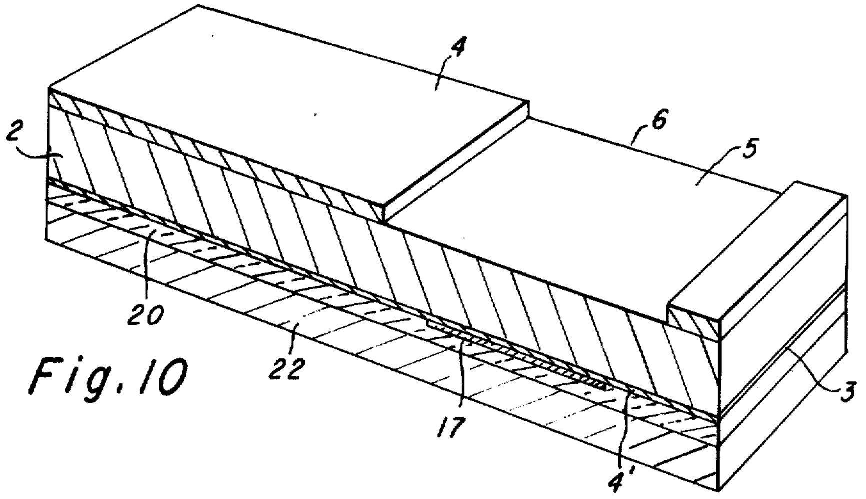
FIGS. 10–13 depict process steps in providing a second embodiment of the present invention.
Figure 11:
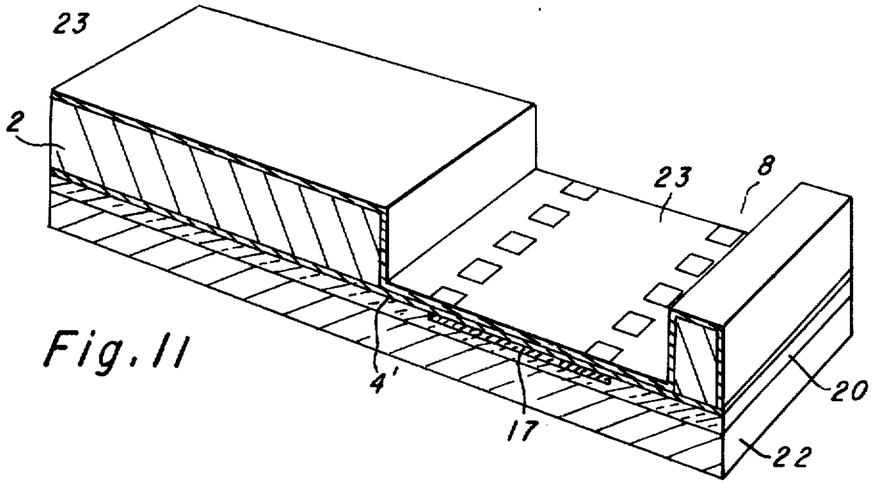
Figure 12:
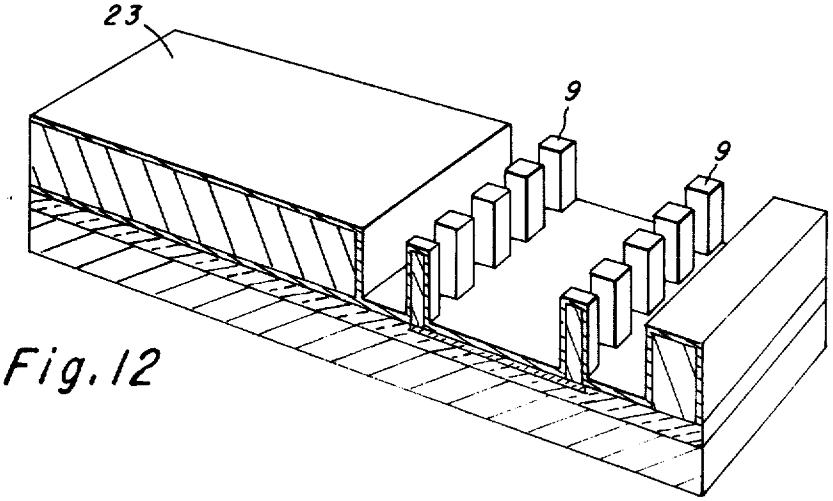

FIGS. 10–12 depict various stages in the production of a second embodiment of the invention. The method of providing the second embodiment utilizes the well-known process of orientation dependent epitaxial growth. The process is explained in detail for a (110) crystallographically oriented silicon slice for growth in the (111) plane in copending patent application, DIELECTRIC ISOLATION PROCESS, Ser. No. 171,665, filed Aug. 13, 1971 and assigned to the assignee of this application. Further reference is directed to the publication *The Influence of Crystal Orientation of Silicon Semiconductor Processing* by K. E. Bean and P. S. Glein, *Proceedings of the IEEE*, Sept., 1969.

FIG. 10 depicts a substrate 2 similar to the substrate 2 of FIG. 1 except that of FIG. 10 has a highly doped p-type layer 4' in surface 3. A highly doped p-type region having a concentration of at least $7 \times 10^{19}$ atoms/$cm^3$ is a well-known ODE etch-stop. A suitable thickness for layer 4 is 0.1 mil, and a suitable doping concentration is $10^{20}$ atoms/$cm^3$. As in FIG. 1 masking layer 4 having aperture 6 therein overlies substrate 2 to provide an orientation dependent etch mask. Aperture 6, as earlier described in accordance with the first embodiment, lies parallel to the line formed by the intersection of the (111) plane with the (110) surface 5. Underlying substrate 2 in FIG. 10 is a suitable etch-stop insulator layer 20, such as silicon nitride having typical thickness of 5,000 angstroms. Underlying layer 20 is a layer 22 of any suitable thickness of, for example, a semiconductor material providing mechanical support, such as polycrystalline silicon. As layer 20 is insulative, layer 22 may be any suitable support material and need not be an insulator.

Also shown in FIG. 10 is one of the metal interconnects 17. Such an interconnect is one of a plurality of selectively spaced and angled interconnects. It also is of the proper length so as to eventually align with the conductive studs subsequently grown.

After having properly masked the device of FIG. 10, an orientation dependent etch step proceeds for the entire 20 mil thickness of substrate 2, stopping at the p+ layer 4', serving as the ODE etch stop. Shown in FIG. 11 is a structure after the orientation dependent etch has provided the groove 8 and after a second oxide mask 23 has been formed in the groove 8. A desired masking pattern of first and second selectively spaced rows of diamond shaped apertures is formed in mask 23 which overlies interconnects 17 and p+ layer 4'. The diamond shaped apertures in the mask 23 which have sides lying in the (111) planes overlie the p+ islands and the metal interconnects 17.

Utilizing the above described method of crystal growth in the orientation dependent epitaxial growth process, semiconductor studs 9 are epitaxially grown to the 20 mil height of surface 5. After the studs 9 have been grown to the desired height, the thin p+ layer 4' is removed by etching with any wellknown silicon etch. The structure of FIG. 12 lying above the nitride layer 20 is an analogous structure to that of FIG. 5. Accordingly, following the technique of the method there described, the circumfusing oxide material and the core material are deposited. After the oxide layer and core material have been suitably placed in the structure of FIG. 12, then if desired, layers 20 and 22 may be removed by any convenient method, such as etching. As earlier described, any excess material overlying original surface 5 is removed by such techniques as lapping so that the upper regions of studs 9 are exposed for electrical interconnection. The upper regions of studs 9 are selectively interconnected in the helix configuration as described in conjunction with FIG. 9 to circumscribe the core material. The resulting structure is shown in FIG. 13.

THE SUBSTRATE-CORE EMBODIMENT

Figures 13, 14A:
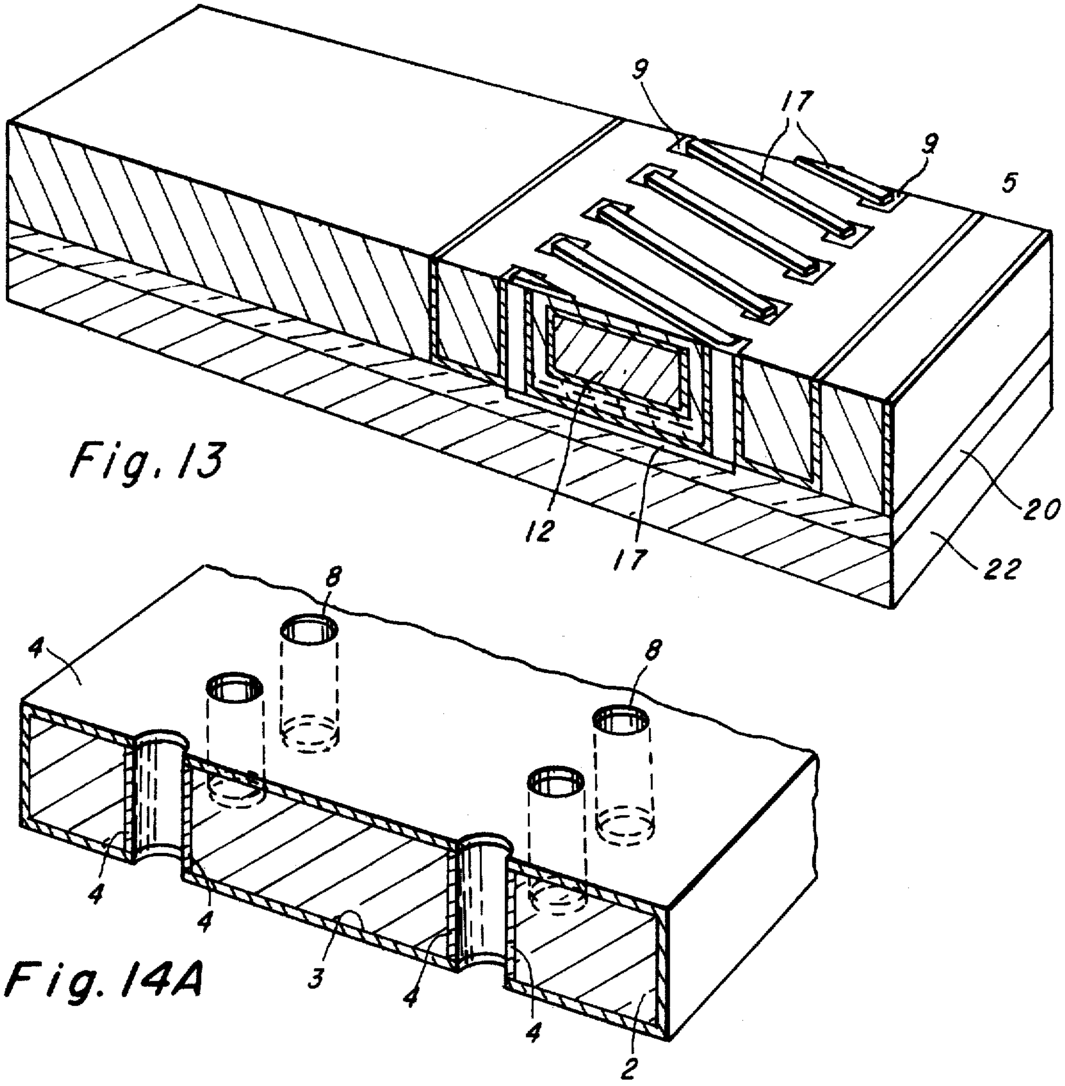
FIGS. 14A and 14B depict a third embodiment of the present invention.
Figure 14B:
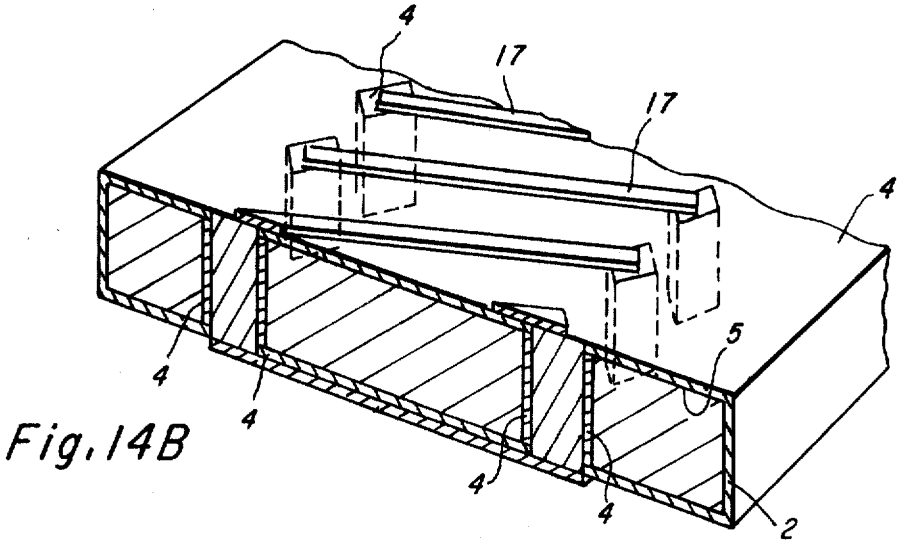

Another embodiment of the invention is depicted in FIGS 14A and 14B wherein the substrate material 2 is utilized as the core material for the solid state inductor. Utilizing a silicon substrate of either type, apertures 8 are orientation dependent etched through the substrate 2. Using masking techniques heretofore described, apertures 8 are patterned in oxide layer 4. Apertures 8 are diamond shpaed and extend completely through the substrate from surface 5 to surface 3. Apertures 8, however, need not be limited to those formed by ODE, but they also are formed by any suitable means such as laser, electron, or ion beam. Utilizing such means as a laser beam allows any substrate material having any crystal orientation to be utilized in place of the (110) silicon.

As shown in FIG. 14B, a metallic interconnect system 17 is then formed within the apertures 8 and overlying oxide layer 4 in a helix configuration. A suitable metal for such a system is gold or aliminum. Oxide layer 4 provides an isolation layer between the substrate 2 and the deposited metal interconnects in the apertures 8 as well as on surfaces 3 and 5.

Equation 1 is equally applicable in the calculation for the inductance for the device depicted in FIG. 14B if the proper permeability, $\mu$, is substituted in Equation 1. For the silicon substrate 2 embodied in FIG. 14B, permeability $\mu$ equals approximately 1.0 and using the dimensions of the device of FIG. 1, except having a slice thickness $t$ = 20 mils = 0.051 cm as the entire slice thickness is utilized, a typical inductance for this embodiment is 25.2 microhenrys.

INTEGRATED CIRCUIT EMBODIMENT

The embodiments of the invention heretofore described have been depicted as discrete electronic semiconductor devices. However, one especially useful feature of the invention is that the various embodiments lend themselves conveniently to combinations in both monolithic and hybrid integrated circuits. Conventionally, a (100) silicon crystal is used in the manufacture of dielectrically isolated integrated circuits, due to the ease with which the V-shaped isolation grooves are etched therein. However, due to the substantially vertical sidewalls of the etched groove in (110) orientation silicon, a substantial packing density improvement is achieved over (100) silicon. In light of the further advantages which (110) oriented silicon offers in the light of applicant's invention, the preferences of (100) orientation silicon may be overshadowed.

As suggested above, conventional integrated circuits may be produced on (110) material as is well-known in the art. Utilizing the scheme of dielectric isolation as exemplified in the above-mentioned copending patent application, IMPROVEMENT IN THE METHODS FOR FORMING CIRCUIT COMPONENTS WITHIN A SUBSTRATE AND SEMICONDUCTOR SUBSTRATE, Ser. No. 788,177, filed Dec. 31, 1968, one or more embodiments of the invention heretofore described are readily combined with conventional integrated circuit technology.

Figure 15:
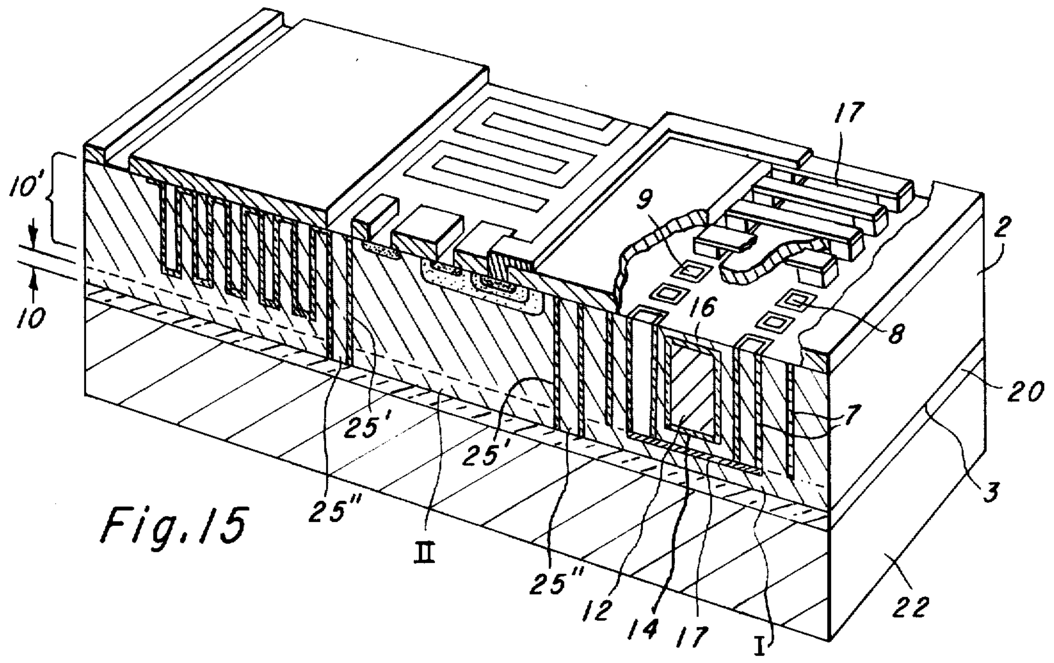
FIGS. 15–17 are perspective views of integrated circuit embodiments of the present invention.

According to the method of this invention, a structure similar to that of FIG. 9 is readily provided in a monolithic integrated circuit. Utilizing well-known techniques in the art of integrated circuits, the above-described process steps are readily accomplished on a slice having therein integrated electronic elements. Shown in FIG. 15 is one embodiment of an integrated circuit having a solid state inductor. The integrated circuit of FIG. 15 is depicted as a dielectrically isolated structure having dielectric isolation regions 25.

Isolation regions 25 comprise layers 25' and region 25''. Utilizing techniques well-known in the art to form the isolation regions, layers 25' typically are comprised of silicon dioxide and regions 25'' are comprised of any suitable material, such as polycrystalline silicon, as described in the above-referenced copending patent application.

Region 25 extends into layer 20 which typically may be a dielectric material such as silicon oxide of 5,000 angstroms thickness. In an integrated circuit utilizing diffused isolation, the isolation regions of the same conductivity type as layer 10, extend only into layer 10. Underlying layer 20 is any suitable support layer 22, which is any desired thickness. As layer 20 is electrical isolation, layer 22 may be slightly conductive, and one such suitable material is polycrystalline silicon of either conductivity type.

In FIG. 15, the substrate 2 has at least two regions of opposite conductivity type. That is, the portion 10 of the substrate 2 between the lower surface 3 and the bottom of the orientation dependent etched grooves is of a first conductivity type. The portion 10' of the substrate 2 lying above portion 10 is of the opposite conductivity type. Methods of epitaxially growing substrate material having a first layer of one conductivity type and a second adjacent layer of opposite conductivity type are well-known in the art. Portion 10' typically is moderately doped to less than $5 \times 10^{18}$ atoms/cm$^3$ as is also portion 10. Portion 10' is moderately doped as transistors are formed in portion 10'.

In FIG. 15, the silicon studs 9 inherently have a relatively high resistance due to the moderately doped portion 10'. As described earlier in conjunction with FIG. 5, a high concentration of dopant of either conductivity is diffused throughout the studs 9 to increase the doping level and thus to lower its resistance. Also, as noted, with respect to FIG. 5, a highly conductive metal coating may be applied to the studs 9 to reduce the resistance therein. Electrical isolation of each stud 9 must be subsequently provided to isolate each stud 9 from each other stud 9 and from the core material 12.

Inductor I differs from the device in FIG. 9 in that the lower interconnect means 17' in FIG. 15 is a highly doped buried layer semiconductor of a type opposite that of portion 10, instead of the metallic interconnect earlier described.

To provide sufficient conductivity for interconnects 17', the doping level of the buried layer is greater than $5 \times 10^{18}$ atoms per cc. The pattern of buried layer 17' is the same as that of the lower metal interconnects described in conjunction with FIG. 11; that is, the buried layer 17' is selectively spaced and angled and of sufficient length to contact the plurality of silicon studs 9 in a helix configuration. The formation of buried layers is well-known in the semiconductor art and reference is made to: R. M. Warner, and J. N. Fordemwalt (eds), *Integrated Circuits*, Chapter 7, MCGRAW HILL BOOK COMPANY, New York, 1965. The helix conductor system circumscribing the core material is accordingly comprised of upper interconnect 17, lower buried layer interconnects 17', and deposited metal studs 28.

The orientation dependent etch step proceeds only to the depth of the buried layer and not through the buried layer 17'. Of course, the two mask alignments as described in conjunction with FIG. 9 are crucial steps prior to the ODE step to insure that the ODE apertures provide studs 9 which impinge upon the buried layer helix configuration 17'.

Figure 16:
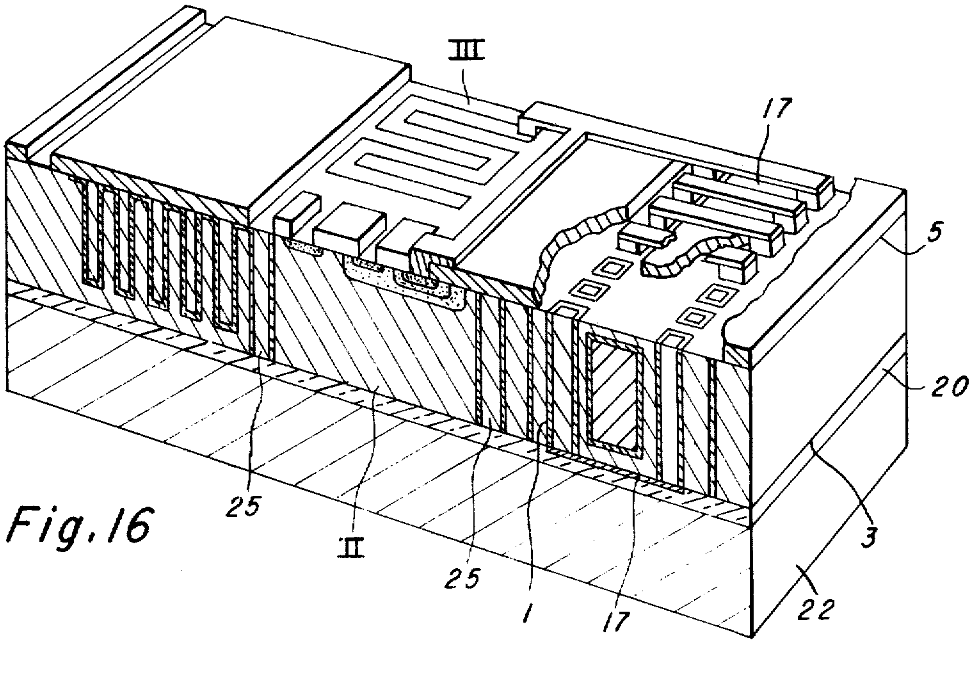

Another embodiment of the present invention is illustrated in FIG. 16 wherein the solid state inductor is the discrete inductor depicted in FIG. 9. Referring to FIG. 15, a buried layer region 17' in this embodiment is not utilized as the lower interconnect system 17 as in the previous embodiment. Instead, the metal interconnect system of FIGS. 10–13 is utilized wherein a selective metal pattern 17 is deposited on surface 3 prior to the formation of etch-stop layer 20. The pattern of the interconnect system is the same helix configuration as earlier described.

After providing interconnects 17 on surface 3 of the integrated circuit substrate 2, and thereafter providing layers 20 and 22 as described for FIG. 15, then an ODE mask layer is utilized on surface 5 as also described for FIG. 15. The subsequent orientation dependent etch step then proceeds until the lower surface 3 and the substrate and the deposited metal 17 are reached. After the ODE step, the metal core 12 is selectively deposited and the isolation layer and the circumfusing material 16 are selectively deposited in accordance with FIGS. 12–13. The formation of upper interconnect system 17 in a helix configuration is also as described for FIG. 13. The resulting structure is shown in FIG. 16 wherein it is noted that the inductor I is selectively connected to the transistor element II and to the resistor III.

SECOND INTEGRATED CIRCUIT INDUCTOR EMBODIMENT

The previously described integrated circuit embodiments have utilized a core material 12 other than that of the substrate 2. As earlier described, a core material 12 may be chosen which a high permeability to provide a relatively high inductance. However, if such a high inductance is not crucial to the integrated circuit, then an integrated circuit embodiment utilizing the device of FIG. 14 is suitable. Using techniques well-known in the art of integrated circuits, after having formed circuit elements such as the transistor II in the substrate, the apertures 8 may be formed through the substrate 2, with a suitable insulating means 1 therein. A suitable metallic interconnect system 17 as described in conjunction with FIG. 14 is then formed to provide the structure of FIG. 17. Transistor II is shown interconnected to one end of the inductor helix which circumscribes the core material 2. It is emphasized that other circuit elements besides transistor II may be connected with the inductor I in integrated circuit form.

Figure 17:
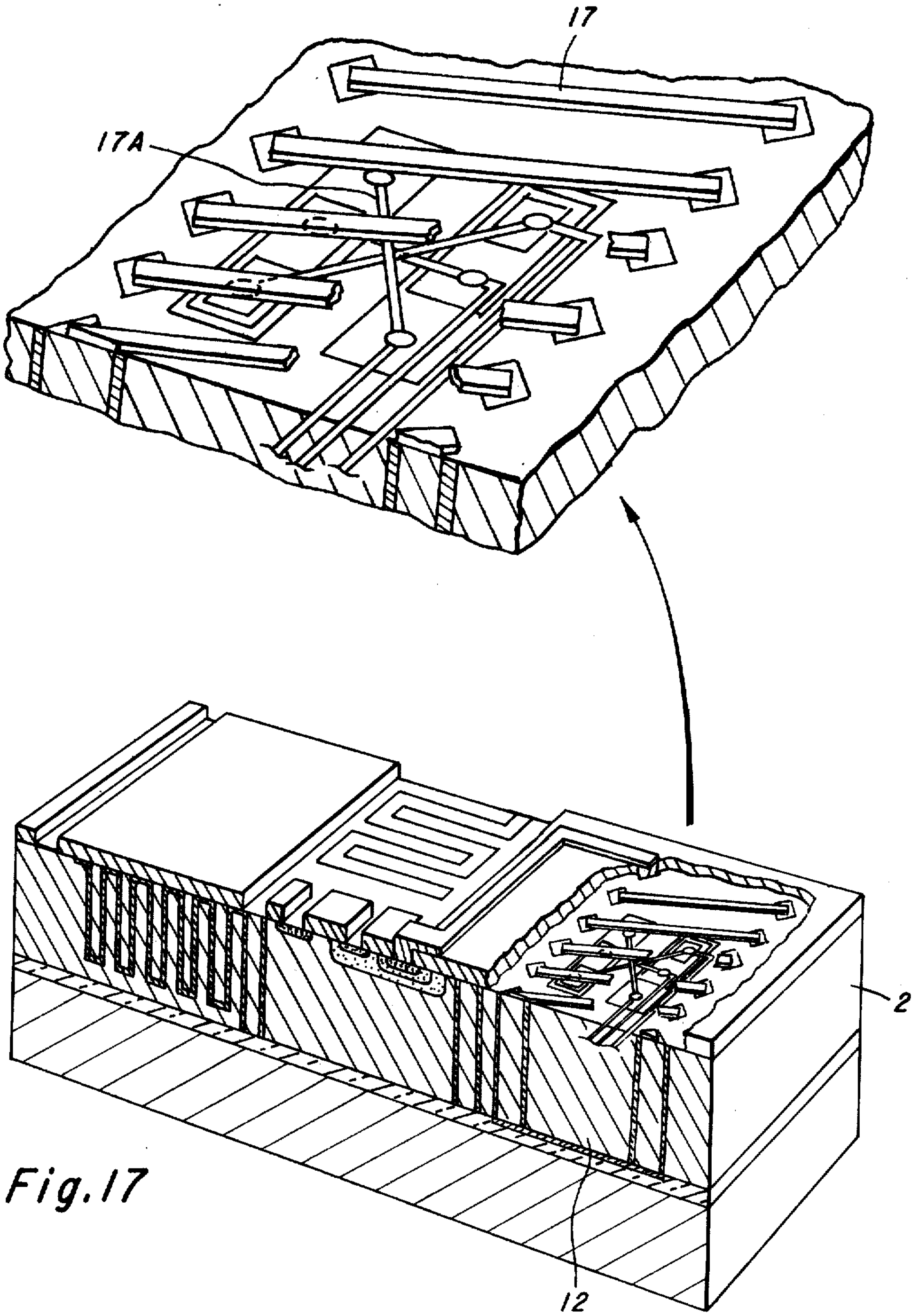

As the embodiment of FIG. 17 is independent of crystal orientation, as earlier noted in accordance with FIG. 14, the substrate 2 need not be limited to silicon of a particular crystal orientation. Indeed, any suitable substrate for monolithic integrated circuits is also suitable for having the solid state inductor constructed therein. For example, germanium and gallium arsenide are suitable substrate materials.

Another suitable substrate material for use as an inductor of this invention is crystalline quartz. Ingegrated acoustic surface wave circuits are fabricated on crystalline quartz substrates and inductance therein in desirable.

The embodiment of FIG. 17 allows the formation of other circuit elements such as transistors, resistors and diodes in the core material 12. Thus, as a solid state inductor providing a large value of inductance may consume a considerable area of substrate 2, by providing circuit elements in the core material the core area is more efficiently utilized. Providing such electronic integrated circuit elements in the core is especially desirable if the core material 12 is silicon, as above described. Such elements may be provided in the core utilizing techniques well-known in the integrated circuit art. Shown in the auxiliary view of FIG. 17 are trnasistors having their interconnects extending beyond the circumscribing helix interconnects 17 of the inductor such that the input and output transistor currents are counteractive; that is, each conteracting the other's induced magnetic fields. Thus the inductance provided by the inductor I is not perturbed by currents entering and leaving the transistors or other devices. Each interconnect 17*a* to the transistor terminals in encased in electrical isolation (not shown) such as silicon oxide so as to be electrically isolated from the helix interconnects 17.

As noted above, by arranging the base, emitter and collector interconnect leads of the transistor as shown in FIG. 17, the transistor current induced magnetic fields do not unduly affect the value of the inductor. On the other hand, the magnetic field induced by the inductor current may affect the devices in the core region. However, semiconductor devices are not highly sensitive to this H-field since the H-field induced by the coil is predominantly in the plane of the surface. That is, since the current carriers in the transistor are predominantly in the plane of the surface and the H-field induced by the coil is predominantly in the plane of the surface, then there is little tendency for the current carriers to be deflected. However, for certain sensitive applications, it may be desirable to use compensating circuit pairs, whose H-field sensitivity is equal and opposite. For example, a pair of transistors hooked in parallel yet physically rotated 180° as shown in the auxiliary view of FIG. 17. Thus, if the Hall voltage generated by the magnetic field of inductor I causes a shift in an important transistor parameter, the companion transistor produces an equal and opposite shift which compensates for the H-field effects. Of course, elements other than transistors may be formed in the core and interconnected in other current compensated methods without departing from the scope of the invention.

It is emphasized that within the scope and context of this invention, the term "helix" and "in a helix configuration" and the like donote the shape of a winding circumscribing a three-dimensional body of any shape, and their meanings are not to be limited by any precise mathematical definition. A typical shape for such a body is rectangular, but other shapes such as round or triangular are equally suitable.

Although specific embodiments of this invention have been described herein, in conjunction with discrete and integrated circuit inductor embodiments, various modifications to the structures and to the details of construction will be apparent to those skilled in the art, without departing from the scope of the invention.

What is claimed is:

1. The method of forming a semiconductor inductor from a semiconductor body having first and second surfaces comprising the steps of:
   a. forming a plurality of selectively spaced parallel grooves in said first surface to provide at least first and second rows of semicondutor material between said grooves,
   b. selectively removing portions of siad first and second rows to provide studs in said first and second rows,
   c. depositing a core material of one permeability between said first and second rows of semiconductor studs,
   d. lapping said lower surface to remove said semiconductor body between said second surface and said grooves, and
   e. selectively electrically interconnecting said semiconductor studs in a helix configuration circumventing said core material.

2. The method of making a semiconductor inductor of claim 1, wherein said semiconductor body comprises silicon.

3. The method of making an inductor of claim 2 wherein said semiconductor studs have sidewalls lying substantially in the (110) crystallographic plane.

4. The method of forming a semiconductor from a semiconductor body having first and second surfaces comprising the steps of:
   a. selectively removing portions of said first surface to provide first and second rows of studs extending substantially to said second surface;
   b. circumfusing said first and second row of studs with a circumfusing material
   c. removing the portion of said semiconductor body between said second surface and the base of said studs; and
   d. selectively electrically interconnecting said semiconductor studs in a helix configuration.

5. The method of making an inductor according to claim 4 and further including the step of depositing a core material between said first and second rows of semiconductors studs such that said step of selectively electrically interconnecting circumvents said core material.

* * * * *